(12) United States Patent
Horii et al.

(10) Patent No.: US 11,398,558 B2
(45) Date of Patent: Jul. 26, 2022

(54) SILICON CARBIDE SEMICONDUCTOR DEVICE

(71) Applicant: SUMITOMO ELECTRIC INDUSTRIES, LTD., Osaka (JP)

(72) Inventors: Taku Horii, Osaka (JP); Toru Hiyoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/253,761

(22) PCT Filed: Jun. 13, 2019

(86) PCT No.: PCT/JP2019/023555
§ 371 (c)(1),
(2) Date: Dec. 18, 2020

(87) PCT Pub. No.: WO2020/004067
PCT Pub. Date: Jan. 2, 2020

(65) Prior Publication Data
US 2021/0265469 A1  Aug. 26, 2021

(30) Foreign Application Priority Data
Jun. 25, 2018  (JP) .............................. JP2018-119591

(51) Int. Cl.
*H01L 29/417*  (2006.01)
*H01L 29/06*  (2006.01)
(Continued)

(52) U.S. Cl.
CPC .... *H01L 29/41741* (2013.01); *H01L 29/0607* (2013.01); *H01L 29/1608* (2013.01);
(Continued)

(58) Field of Classification Search
CPC ........... H01L 29/41741; H01L 29/0607; H01L 29/1608; H01L 29/401; H01L 29/41775;
(Continued)

(56) References Cited

U.S. PATENT DOCUMENTS

| 6,262,439 B1 | 7/2001 | Takeuchi et al. |
| 8,686,435 B2 | 4/2014 | Masuda et al. |
| 2020/0203482 A1* | 6/2020 | Kaji ........................ H01L 29/78 |

FOREIGN PATENT DOCUMENTS

| JP | H11-163341 | 6/1999 |
| JP | 2012-216701 | 11/2012 |
| WO | 2017/169777 | 10/2017 |

* cited by examiner

*Primary Examiner* — Cuong B Nguyen
(74) *Attorney, Agent, or Firm* — IPUSA, PLLC

(57) ABSTRACT

A silicon carbide semiconductor device to be a vertical transistor includes: a silicon carbide semiconductor first layer 21 of a first conductivity type; a silicon carbide semiconductor second layer 22 of a second conductivity type that is different from the first conductivity type on the first layer 21; a silicon carbide semiconductor third layer 120 of the first conductivity type on the second layer 22; and a groove 30 having a sidewall 30a at portions of the third layer 120, the second layer 22, and the first layer 21, wherein the third layer 120 has a first area 121 facing the sidewall 30a of the groove 30 and a second area 122 further away from the sidewall 30a of the groove 30 than the first area 121, wherein the second area 122 and the first area 121 are continuous, and wherein the second area 122 is provided deeper than the first area 121 from a surface side of the third layer 130 toward the first layer 21.

6 Claims, 16 Drawing Sheets

(51) Int. Cl.
*H01L 29/16* (2006.01)
*H01L 29/40* (2006.01)
*H01L 29/66* (2006.01)
*H01L 29/78* (2006.01)

(52) U.S. Cl.
CPC ...... *H01L 29/401* (2013.01); *H01L 29/41775* (2013.01); *H01L 29/66068* (2013.01); *H01L 29/7827* (2013.01)

(58) Field of Classification Search
CPC ........... H01L 29/66068; H01L 29/7827; H01L 21/046; H01L 29/086; H01L 29/0869; H01L 29/1095; H01L 29/42376; H01L 29/41766; H01L 29/42368; H01L 29/7813; H01L 29/0696; H01L 29/7375; H01L 29/7393–7395; H01L 29/7397; H01L 29/66325; H01L 29/66333–66348; H01L 29/4236; H01L 29/42352; H01L 29/66613–66628; H01L 29/42356
See application file for complete search history.

SILICON CARBIDE SEMICONDUCTOR DEVICE

TECHNICAL FIELD

The present disclosure relates to a silicon carbide semiconductor device.

The present application is based on and claims priority to Japanese Patent Application No. 2018-119591, filed on Jun. 25, 2018, the entire contents of the Japanese Patent Application being hereby incorporated herein by reference.

BACKGROUND ART

Silicon carbide has a wider band gap than silicon, which is widely used in semiconductor devices, and is therefore used in high withstand voltage semiconductor devices and the like. In such a semiconductor device using silicon carbide, there is a vertical transistor in which a source electrode is formed on a first surface of a substrate and a drain electrode is formed on a second surface of the substrate from the viewpoint of the withstand voltage.

PRIOR ART DOCUMENT

Patent Document

[Patent Document 1] Japanese Laid-open Patent Publication No. 2012-216701

SUMMARY OF THE INVENTION

According to one aspect of the present embodiment, it is a vertical transistor including: a silicon carbide semiconductor first layer of a first conductivity type; a silicon carbide semiconductor second layer of a second conductivity type that is different from the first conductivity type on the first layer; a silicon carbide semiconductor third layer of the first conductivity type on the second layer; and a groove having a sidewall at portions of the third layer, the second layer, and the first layer. Also, the third layer has a first area facing the sidewall of the groove and a second area further away from the sidewall of the groove than the first area, the second area and the first area are continuous, and the second area is provided deeper than the first area from a surface side of the third layer toward the first layer.

EMBODIMENT FOR CARRYING OUT THE INVENTION

Figure 1:
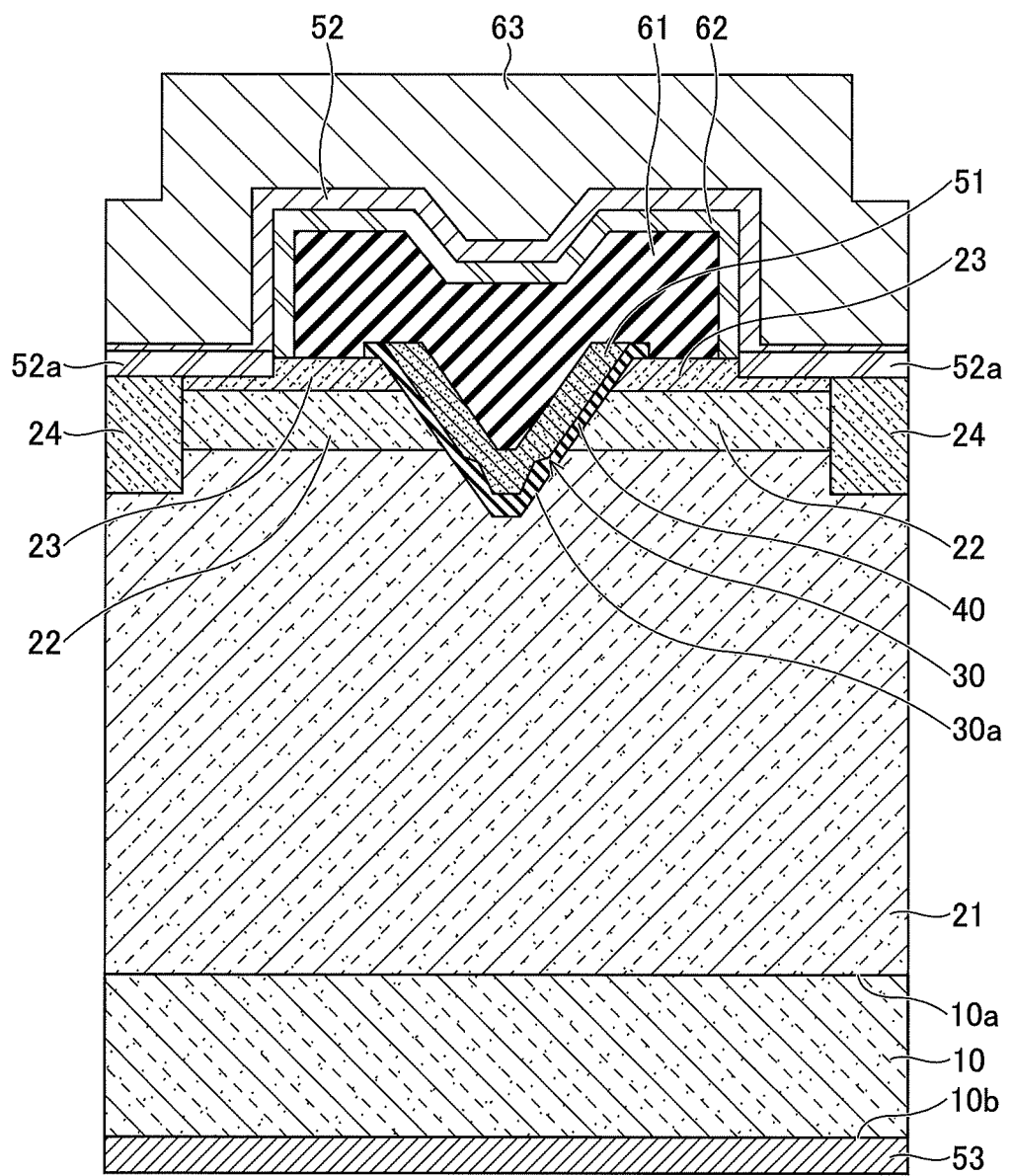
FIG. 1 is a structural diagram of a silicon carbide semiconductor device.

In a vertical transistor, in order to reduce the contact resistance at a source electrode, the source electrode is formed to be in contact with an n-area where an impurity element for n-type is doped at a high concentration. However, for reasons of a manufacturing process, when the n-area is partially removed from the surface, there may be a case in which the concentration of the impurity element at the portion in contact with the source electrode may be decreased. In such a case, the contact resistance with the source electrode is increased and it is not possible to cause a large current to flow.

For this reason, there is a need for silicon carbide semiconductor devices in which the concentration of an impurity element at a portion in contact with the source electrode is high and enable a large current to flow.

According to the present disclosure, in a silicon carbide semiconductor device, the concentration of an impurity element at a portion in contact with a source electrode is high, enabling a large current to flow.

An embodiment for carrying out will be described below.

Description of Embodiment of the Present Disclosure

To begin with, aspects of the present disclosure are listed and described below. In the following description, the same reference characters are allotted to the same or corresponding elements and the same descriptions thereof are not repeated. In addition, regarding crystallographic denotation in the specification of the present application, an individual orientation, a group orientation, an individual plane, and a group plane are indicated by [ ], < >, ( ) and { }, respectively. Here, although a crystallographically negative index is usually expressed by a number with a bar "-" thereabove, a negative sign in the specification of the present application precedes a number to express a crystallographically negative index in this specification. In addition, the epitaxial growth of the present disclosure is a homoepitaxial growth.

<1> According to one aspect of the present disclosure, a silicon carbide semiconductor device is a vertical transistor and includes: a silicon carbide semiconductor first layer of a first conductivity type; a silicon carbide semiconductor second layer of a second conductivity type that is different from the first conductivity type on the first layer; a silicon carbide semiconductor third layer of the first conductivity type on the second layer; and a groove having a sidewall at portions of the third layer, the second layer, and the first layer, wherein the third layer has a first area facing the sidewall of the groove and a second area further away from the sidewall of the groove than the first area, wherein the second area and the first area are continuous, and wherein the second area is provided deeper than the first area from a surface side of the third layer toward the first layer.

When manufacturing a silicon carbide semiconductor device to be a vertical transistor, the silicon carbide semiconductor layer at an area in contact with a source electrode is removed from the surface, the impurity concentration in the area in contact with the source electrode is actually decreased and, and the contact resistance is increased. Therefore, a current that can flow is decreased. As a solution to this, the contact resistance with the source electrode can be reduced by thickening the area in contact with the source electrode where the impurity element is doped. However, thickening the area in contact with the source electrode where the impurity element is doped requires significant design changes in the entire silicon carbide semiconductor device and is not readily available.

In view of the above, the inventors of the present application have arrived at forming an area, which is in contact with the source electrode, to be deeper than other areas, among the areas in which an impurity element is doped. Thereby, because the contact resistance between the source electrode and the silicon carbide semiconductor layer can be reduced without a significant design change in the entire vertical silicon carbide semiconductor device, it is possible to cause a large current to flow.

<2> A source electrode in contact with the second area of the third layer is included.

<3> The first layer is formed on a first surface of a silicon carbide substrate, an insulating film is provided within the groove, a gate electrode is provided on the insulating film, and a drain electrode is provided on a second surface, which is opposite to the first surface, of the silicon carbide substrate.

<4> The source electrode includes Ni.

<5> The source electrode includes Al, Ti and Si.

<6> The second area is provided deeper than the first area by 0.1 µm or more from the surface of the third layer toward the first layer.

<7> A vertical transistor includes: a silicon carbide semiconductor first layer of a first conductivity type; a silicon carbide semiconductor second layer of a second conductivity type that is different from the first conductivity type on the first layer; a silicon carbide semiconductor third layer of the first conductivity type on the second layer; and a groove having a sidewall at portions of the third layer, the second layer, and the first layer, wherein the third layer has a first area facing the sidewall of the groove and a second area further away from the sidewall of the groove than the first area, wherein the second area and the first area are continuous, wherein the second area is provided deeper than the first area from a surface side of the third layer toward the first layer, wherein the vertical transistor includes a source electrode in contact with the second area of the third layer, wherein the first layer is formed on a first surface of a silicon carbide substrate, wherein an insulating film is provided within the groove, wherein a gate electrode is provided on the insulating film, wherein a drain electrode is provided on a second surface, which is opposite to the first surface, of the silicon carbide substrate, wherein the source electrode includes Ni, and wherein the second area is provided deeper than the first area by 0.1 µm or more from the surface of the third layer toward the first layer.

Details of Embodiment of the Present Disclosure

In the following, an embodiment of the present disclosure (which is hereinafter referred to as the "present embodiment") will be described in detail, but the present embodiment is not limited to the following.

First, in a silicon carbide semiconductor device to be a vertical transistor, a decrease in the impurity concentration of a silicon carbide semiconductor layer in an area in contact with a source electrode will be described with reference to FIG. 1. It should be noted that in the following drawings, for convenience, the film thickness, the width, and the like of each layer forming the silicon carbide semiconductor device are different from the actual ones.

In a semiconductor device to be a vertical transistor illustrated in FIG. 1, on a first surface 10a of a silicon carbide single-crystal substrate 10, a first n-type layer 21, a p-type layer 22, and a second n-type layer 23 are formed in that order. Also, a groove 30 is formed by removing the second n-type layer 23, the p-type layer 22, and the first n-type layer 21. The groove 30 is formed in a V-shape in the cross-section, and at a side wall 30a of the groove 30, portions of the second n-type layer 23, the p-type layer 22, and the first n-type layer 21 are exposed. The side wall 30a of the groove 30 is covered by a gate insulating film 40 and a gate electrode 51 is formed on the gate insulating film 40 within the groove 30.

Further, high concentration p-type area 24 having a high impurity concentration are formed in an area away from the groove 30 by ion implantation of an impurity element having for p-type. An interlayer insulating film 61 is formed on a gate electrode 51 to cover the entire gate electrode 51, and a barrier metal layer 62 is formed to cover the interlayer insulating film 61. A source electrode 52 is formed by a Ni film on the barrier metal layer 62 and portions of the second n-type layer 23 and the high concentration p-type area 24. The portions of the second n-type layer 23 and the high concentration p-type area 24, which are a silicon carbide semiconductor layer containing Si and are in contact with the source electrode 52, are subject to a heat treatment, and thereby, Ni and Si are alloyed to form an NiSi alloy layer 52a. By the NiSi alloy layer 52a formed in this manner, it is possible to reduce contact resistance between the source electrode 52 and the second n-type layer 23 of the silicon carbide semiconductor layer. It should be noted that a drain electrode 53 is formed on a second surface 10b opposite to the first surface 10a of the silicon carbide single-crystal substrate 10, and a source wiring layer 63 is formed on the source electrode 52 by Al (aluminum).

The first n-type layer 21 is a layer in which an impurity element for n-type is doped at a relatively low concentration and is an n-type drift layer. The p-type layer 22 is a p-type body layer in which an impurity element for p-type is doped. The second n-type layer 23 is an n-type layer in which an impurity element for n-type is doped at a concentration higher than in the first n-type layer 21.

In the vertical semiconductor device illustrated in FIG. 1, upon a predetermined voltage being applied to the gate electrode 51, a channel is formed in an area near the gate insulating film 40 of the p-type layer 22, and the first n-type layer 21 and the second n-type layer 23 are electrically conducted. This causes a current to flow between the source electrode 52 and the drain electrode 53, turning on the semiconductor device. It should be noted that when a predetermined voltage is not applied to the gate electrode 51, a channel is not formed in the p-type layer 22, and a current does not flow between the source electrode 52 and the drain electrode 53, and therefore, it is in the off state.

For the vertical silicon carbide semiconductor device illustrated in FIG. 1, a silicon carbide epitaxial substrate having a silicon carbide epitaxial layer formed on a first surface 10a of a silicon carbide single-crystal substrate 10 is used. In the silicon carbide epitaxial layer, an impurity element for n-type is doped. From the surface of the silicon carbide epitaxial layer, the p-type layer 22 is formed by ion implantation of Al as an impurity element for p-type, and the second n-type layer 23 is formed by ion implantation of P (phosphorus) as an impurity element for n-type. In ion implantation of the silicon carbide epitaxial layer, by changing the accelerating voltage or the like of ions of the impurity element to be ion-implanted, the depth of the ions of the impurity element to be ion-implanted can be changed. In this manner, the second n-type layer 23 is formed on the surface side of the silicon carbide epitaxial layer, and the p-type layer 22 is formed in an area deeper than the second n-type layer 23. Also, the high concentration p-type area 24 is formed by implanting ions of Al as an impurity element for p-type from the surface of the silicon carbide epitaxial layer. In the silicon carbide epitaxial layer, the area excluding the p-type layer 22, the second n-type layer 23, and the high concentration p-type area 24 in which the impurity elements are ion-implanted is the first n-type layer 21.

Figure 2:
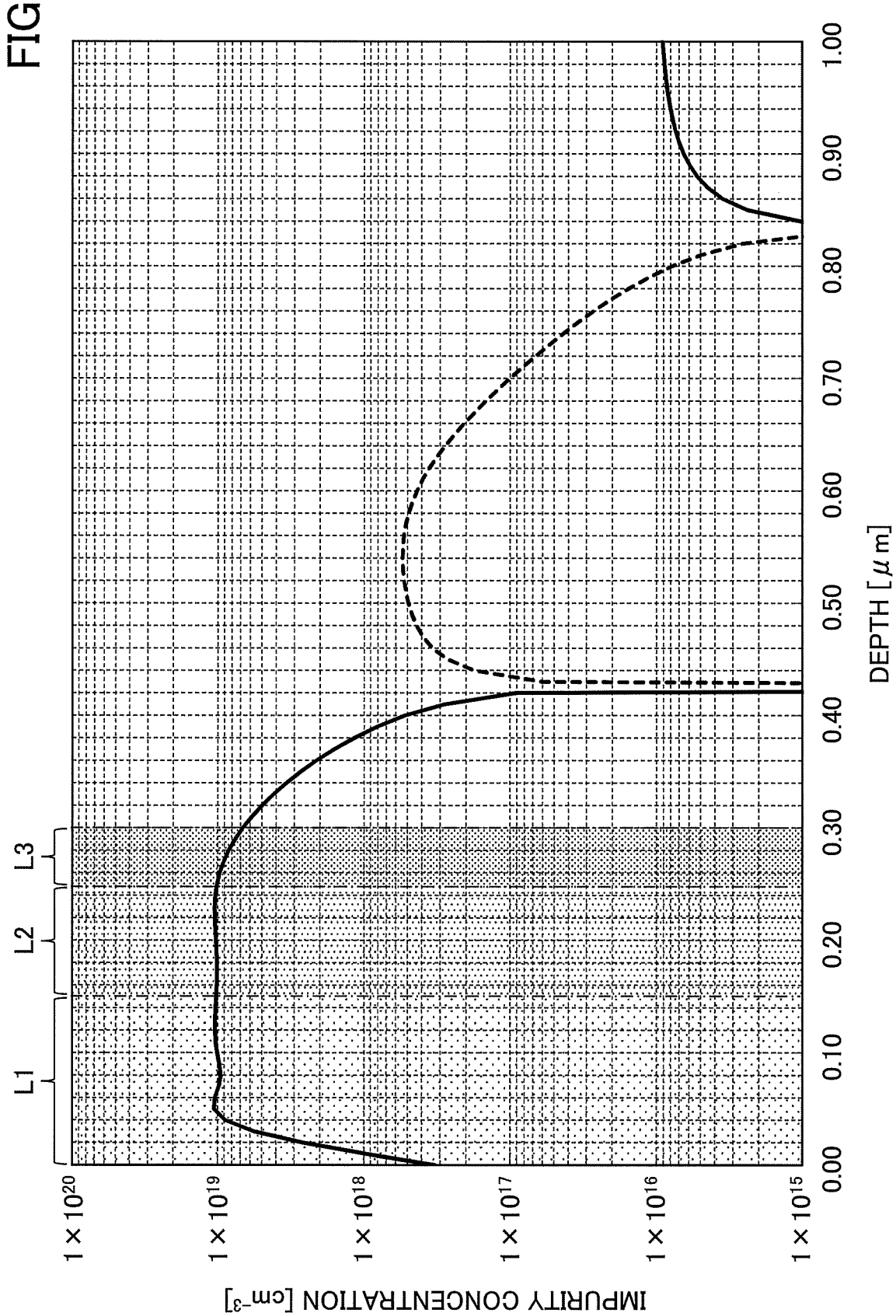
FIG. 2 is a diagram describing the impurity concentration in the silicon carbide semiconductor device.

Specifically, as illustrated in FIG. 2, the second n-type layer 23 is formed by implanting ions of P to a depth of about 0.42 μm from the surface of the silicon carbide epitaxial layer. Also, the p-type layer 22 is formed by implanting ions of Al from the depth of about 0.42 μm to about 0.83 μm. FIG. 2 illustrates the relationship between the depth from the surface of the silicon carbide epitaxial layer and the concentration of the ion-implanted impurity element. Because the second n-type layer 23 is formed by ion implantation, it is extremely difficult to form the second n-type layer 23 such that the area from the surface up to about 0.42 μm in depth has a uniform impurity concentration. Thus, as illustrated in FIG. 2, in the area where the depth is from 0.05 μm to 0.3 μm the concentration of the impurity element is greater than $1 \times 10^{19}$ $cm^{-3}$. In contrast, in the area deeper than 0.3 μm, the impurity concentration gradually decreases as the depth increases. It should be noted that it is extremely difficult to form the p-type layer 22 at a uniform concentration in the depth direction.

Here, although a silicon carbide semiconductor device is fabricated by processing a silicon carbide epitaxial substrate in which impurity elements are ion-implanted as described above, in a step of fabrication, the surface of the silicon carbide epitaxial layer may be partially removed. Specifically, in a step of forming an oxide film on the surface of the silicon carbide epitaxial layer, in a step of removing the deposited interlayer insulating film 61 and the barrier metal layer 62 and exposing the surface of the second n-type layer 23, and in a step of forming the NiSi alloy layer 52a, it is partially removed. As described above, upon the surface of the silicon carbide epitaxial layer being partially removed, the second n-type layer 23 becomes thinner, an area with a low concentration of the impurity element is exposed, and the contact resistance with the source electrode 52 is increased. Therefore, it becomes impossible to cause a large current to flow.

More particularly, steps of manufacturing a silicon carbide semiconductor device will be described with reference to FIG. 3 to FIG. 11. It should be noted that FIG. 3 to FIG. 11 partially differ from FIG. 1 in the shapes and the like for convenience.

Figure 3:
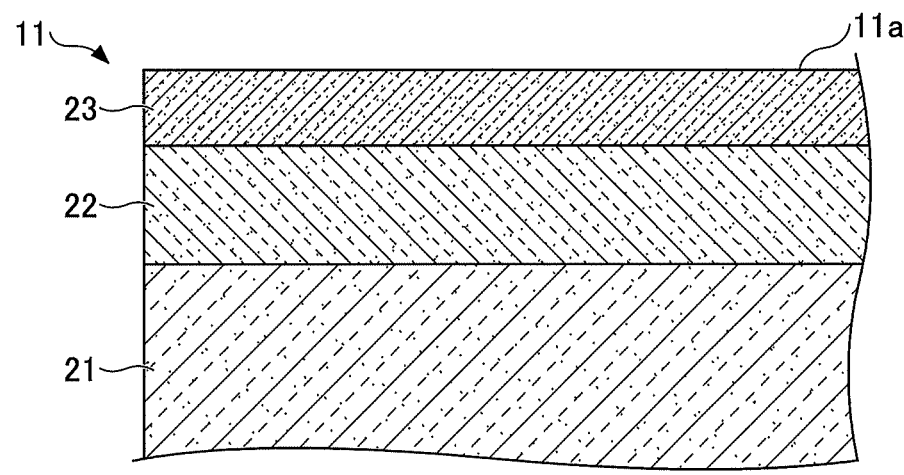
FIG. 3 is a diagram of a step (1) of a method of manufacturing a silicon carbide semiconductor device.

For the silicon carbide semiconductor device, initially, as illustrated in FIG. 3, from a surface 11a of a silicon carbide epitaxial layer 11 formed on a silicon carbide single-crystal substrate 10, a p-type layer 22 is formed by ion implantation of Al and a second n-type layer 23 is formed by ion implantation of P. Specifically, an unillustrated implant through film is formed on the surface 11a of the silicon carbide epitaxial layer 11 of the silicon carbide epitaxial substrate, and then an ion implantation of an impurity element is performed. The implant through film is made of silicon oxide or polysilicon and is removed by etching after the ion implantation of the impurity element is completed. FIG. 2 illustrates the relationship between the depth from the surface 11a of the silicon carbide epitaxial layer 11 in a state in which ions are implanted in this manner and the impurity concentration.

The second n-type layer 23 is formed to a depth of about 0.42 μm from the surface 11a of the silicon carbide epitaxial layer 11 by implanting ions of P that is an impurity element for n-type. Therefore, the area in which the concentration of the impurity element for n-type is $1 \times 10^{19}$ $cm^{-3}$ or more is the area from about 0.04 μm to about 0.25 μm in depth from the surface 11a, and whether it is shallower or deeper than this area, the concentration of the impurity element for n-type decreases. Accordingly, in the area where the depth from the surface 11a of the silicon carbide epitaxial layer 11 is about 0.25 μm or more, the concentration of the impurity element for n-type gradually decreases as the depth increases. It should be noted that although the second n-type layer 23 is also doped with the impurity element for p-type, because the concentration of the impurity element for n-type is much higher than that of the impurity element for p-type, the second n-type layer 23 is n-type.

Also, the p-type layer 22 is formed from the depth of about 0.42 μm to about 0.83 μm from the surface 11a of the silicon carbide epitaxial layer 11 by implanting ions of Al, which is an impurity element for p-type. Thus, in the area where the depth is about 0.54 μm, the concentration of the impurity element for p-type is greater than or equal to $5 \times 10^{17}$ cm$^{-3}$, and whether it is shallower or deeper than this area, the concentration of the impurity element for p-type decreases. It should be noted that in the silicon carbide epitaxial layer 11, P, which is an impurity element for n-type, is doped at a concentration of about $1 \times 10^{16}$ cm$^{-3}$. Therefore, in the silicon carbide epitaxial layer 11, the area excluding the second n-type layer 23 and the p-type layer 22 formed by ion implantation is the first n-type layer 21.

Figure 4:
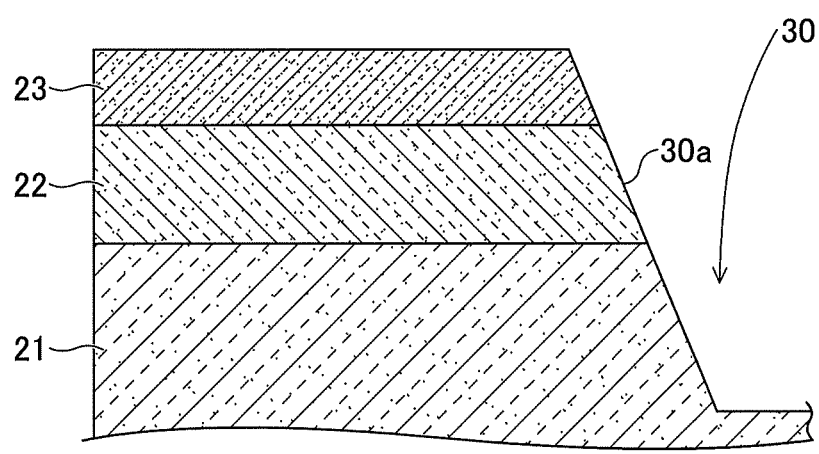
FIG. 4 is a diagram of a step (2) of the method of manufacturing the silicon carbide semiconductor device.
Figure 5:
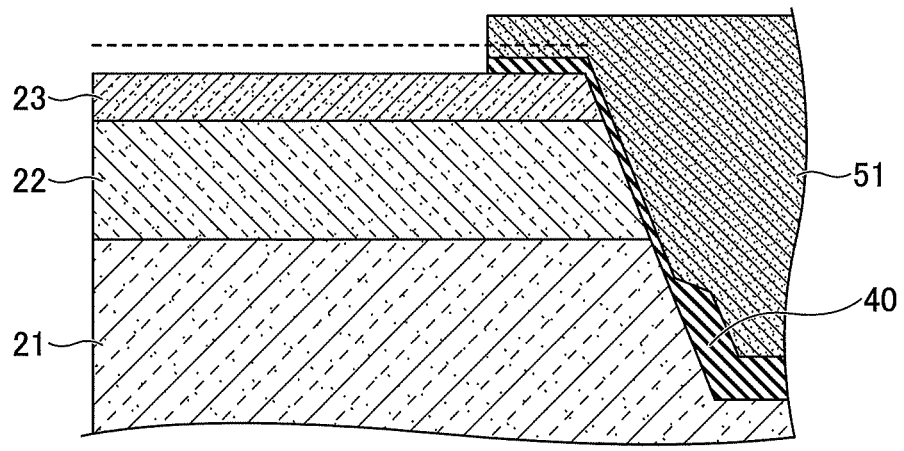
FIG. 5 is a diagram of a step (3) of the method of manufacturing the silicon carbide semiconductor device.

Next, as illustrated in FIG. 4, the groove 30 is formed by partially removing the silicon carbide epitaxial layer from the surface on which the second n-type layer 23 is formed, and portions of the second n-type layer 23, the p-type layer 22, and the first n-type layer 21 are exposed at the side wall 30a of the groove 30. Thereafter, as illustrated in FIG. 5, the gate insulating film 40 is formed within the groove 30, and the gate electrode 51 is further formed on the gate insulating film 40. In the steps described above, due to the steps of forming and removing the implant through film and forming the gate insulating film 40, the second n-type layer 23 is lost about by 0.15 μm in thickness, as illustrated by L1 in FIG. 2.

Figure 6:
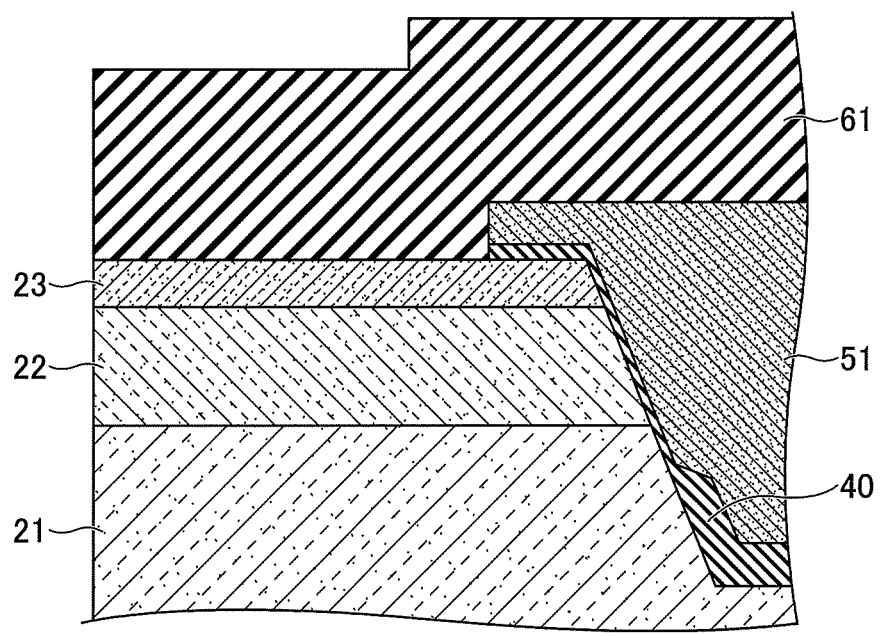
FIG. 6 is a diagram of a step (4) of the method of manufacturing the silicon carbide semiconductor device.

Next, as illustrated in FIG. 6, on the entire surfaces of the gate electrode 51 and the second n-type layer 23, the interlayer insulating film 61 is formed by depositing a silicon oxide film.

Figure 7:
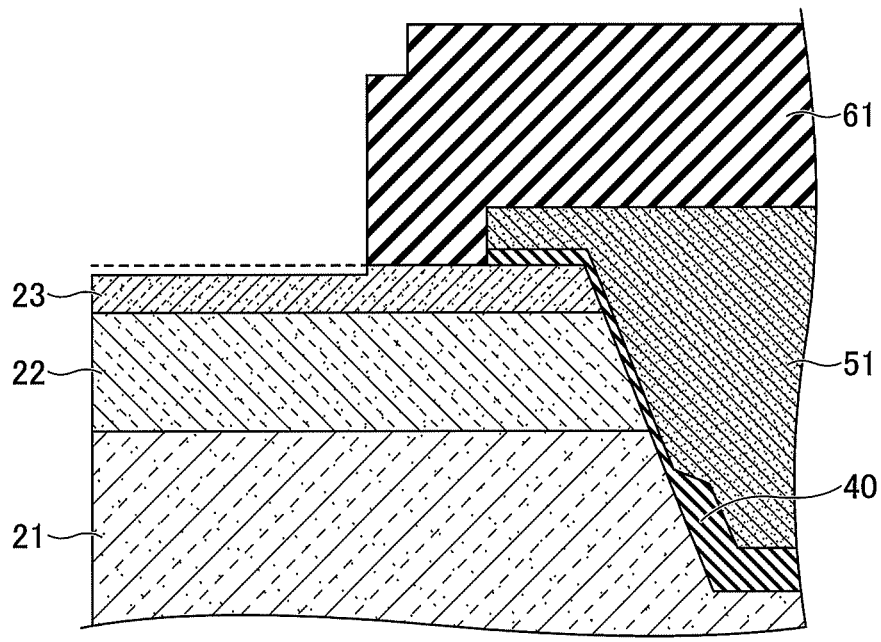
FIG. 7 is a diagram of a step (5) of the method of manufacturing the silicon carbide semiconductor device.

Next, as illustrated in FIG. 7, the interlayer insulating film 61 at the area where the source electrode is to be formed on the second n-type layer 23 is removed. Specifically, a photoresist is applied on the interlayer insulating film 61, and then it is exposed and developed by an exposure apparatus to form an unillustrated resist pattern having an opening in the area where the source electrode 52 is formed to be on the second n-type layer 23. Thereafter, the interlayer insulating film 61 at the area where the resist pattern is not formed is removed by dry etching such as RIE (Reactive Ion Etching) to expose the second n-type layer 23. At this time, it is extremely difficult to stop the etching immediately after the interlayer insulating film 61 is removed and the second n-type layer 23 is exposed, and there is a variation in the etching and the like. Therefore, a part of the second n-type layer 23 is removed by over-etching.

Figure 8:
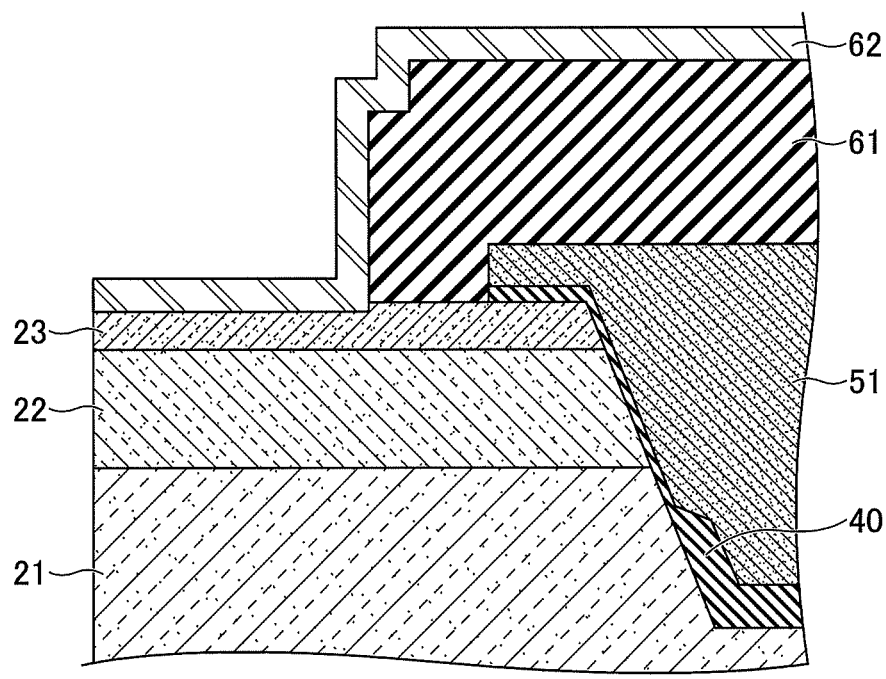
FIG. 8 is a diagram of a step (6) of the method of manufacturing the silicon carbide semiconductor device.

Next, as illustrated in FIG. 8, on the entire surfaces of the interlayer insulating film 61 and the second n-type layer 23, the barrier metal layer 62 is formed by depositing a titanium nitride film.

Figure 9:
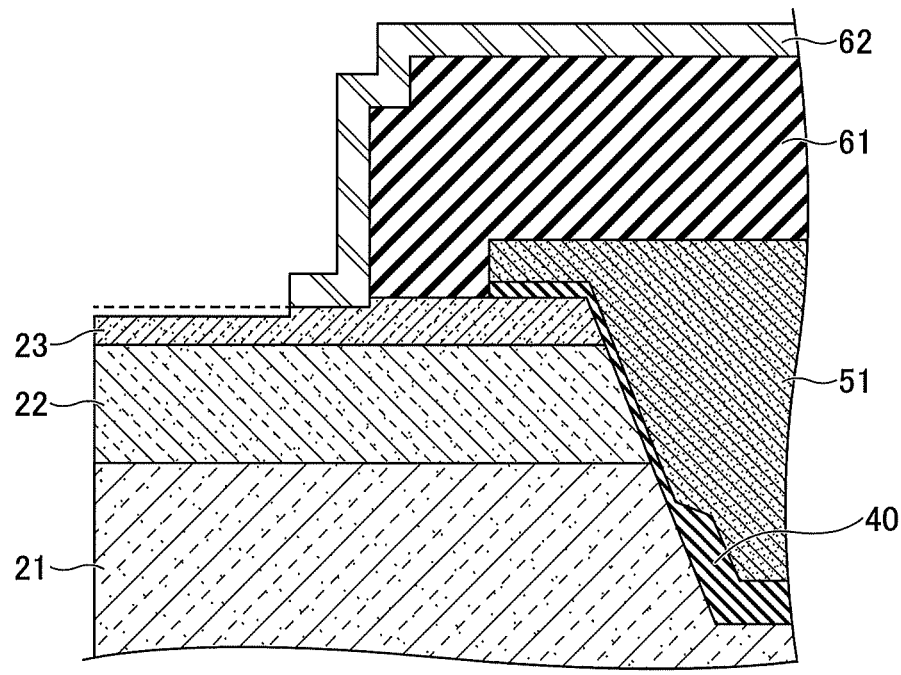
FIG. 9 is a diagram of a step (7) of the method of manufacturing the silicon carbide semiconductor device.

Next, as illustrated in FIG. 9, the barrier metal layer 62 at the area where the source electrode 52 is to be formed on the second n-type layer 23 is removed. Specifically, a photoresist is applied on the barrier metal layer 62, and it is exposed and developed by an exposure apparatus to form an unillustrated resist pattern having an opening in the area where the source electrode 52 is to be formed on the second n-type layer 23. Thereafter, the barrier metal layer 62 at the area where the resist pattern is not formed is removed by dry etching such as RIE to expose the second n-type layer 23. At this time, it is extremely difficult to stop the etching immediately after removing the barrier metal layer 62 and exposing the second n-type layer 23, and there is a variation in the etching and the like. Therefore, a part of the second n-type layer 23 is removed by over-etching.

Accordingly, due to the step of forming the interlayer insulating film 61 and the over-etching of the second n-type layer 23 in the step of foiling the barrier metal layer 62, the second n-type layer 23 is lost by about 0.1 μm in thickness, as illustrated by L2 in FIG. 2. 2.

Figure 10:
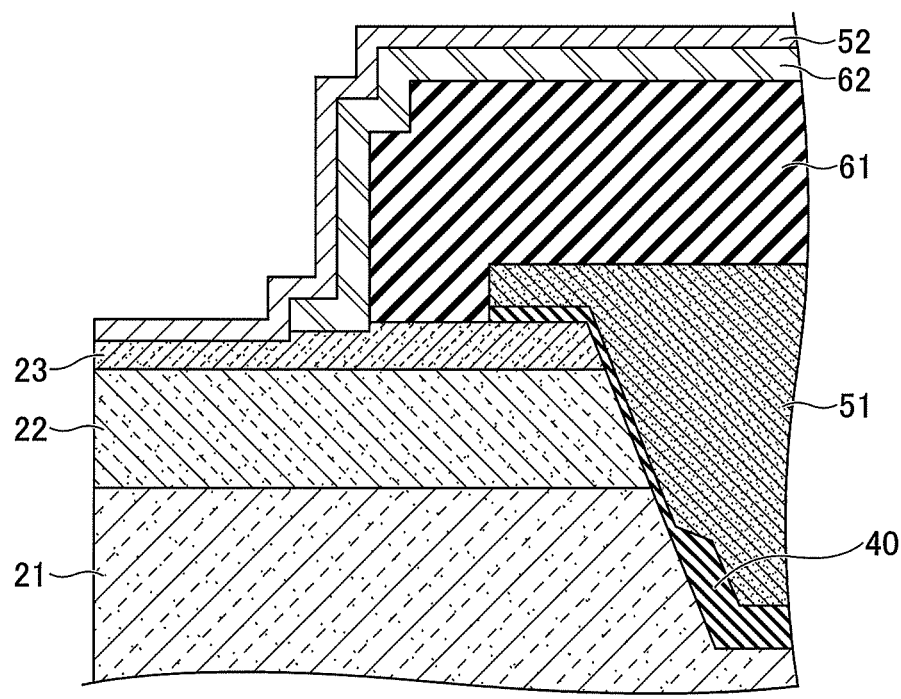
FIG. 10 is a diagram of a step (8) of the method of manufacturing the silicon carbide semiconductor device.

Next, as illustrated in FIG. 10, a nickel (Ni) film is deposited on the barrier metal layer 62 and the second n-type layer 23 to form the source electrode 52.

Figure 11:
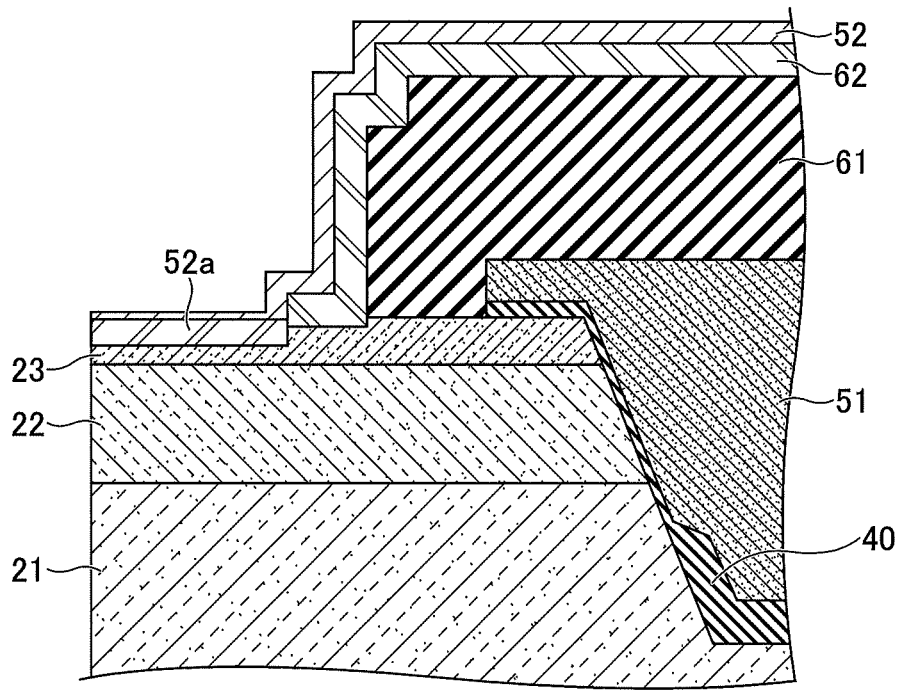
FIG. 11 is a diagram of a step (9) of the method of manufacturing the silicon carbide semiconductor device.

Next, as illustrated in FIG. 11, by performing a heat treatment, Si of the second n-type layer 23 and the Ni film forming the source electrode 52 on the second n-type layer 23 are alloyed to form the NiSi alloy layer 52a. It should be noted that the NiSi alloy layer 52a is a NiSi alloy but is part of the source electrode 52.

In this step, when the NiSi alloy layer 52a is formed, because Si in the silicon carbide semiconductor is used, the second n-type layer 23 is lost by about 0.05 μm in thickness, as illustrated by L3 of FIG. 2.

As described above, when manufacturing the silicon carbide semiconductor device having a structure illustrated in FIG. 1, the second n-type layer 23 is lost from the surface 11a by about 0.3 μm, which is the sum of L1, L2, and L3. Thus, the concentration of the impurity element of the second n-type layer 23 in contact with the source electrode 52 is $6 \times 10^{18}$ cm$^{-3}$ to $7 \times 10^{18}$ cm$^{-3}$ lower than $1 \times 10^{19}$ cm$^{-3}$. In this manner, when the concentration of the impurity element of the second n-type layer 23 in contact with the source electrode 52 is low, the contact resistance with the NiSi alloy layer 52a is high and therefore, it is impossible to cause a large current to flow.

Figure 12:
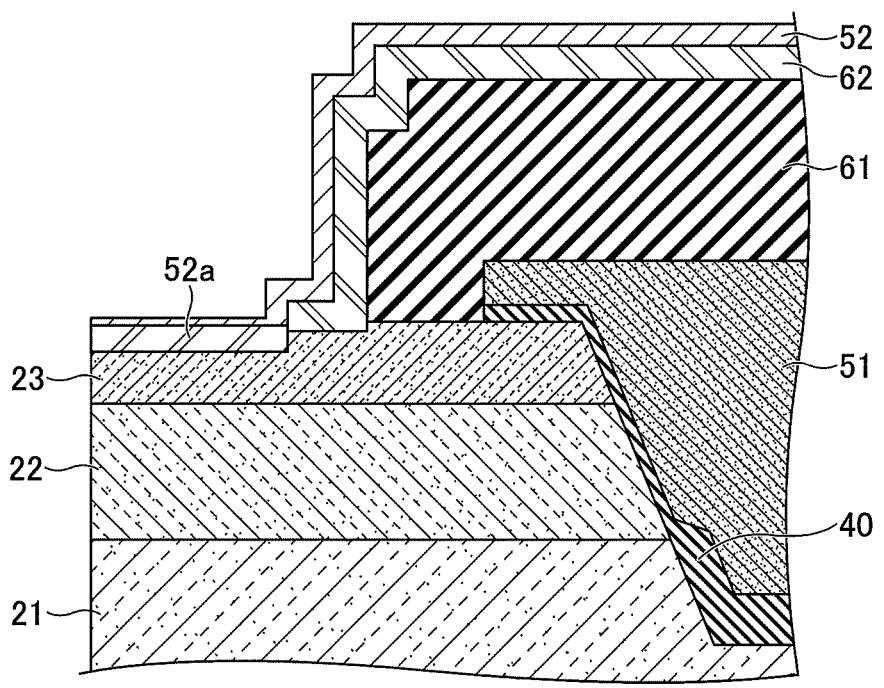
FIG. 12 is a structural diagram of another silicon carbide semiconductor device.

Therefore, by increasing the thickness of the second n-type layer 23 as in the semiconductor device having the structure illustrated in FIG. 12, the problem described above can be solved. However, this is impractical because it affects the depth of the groove 30 or the like and requires various design changes.

(Silicon Carbide Semiconductor Device)

Figure 13:
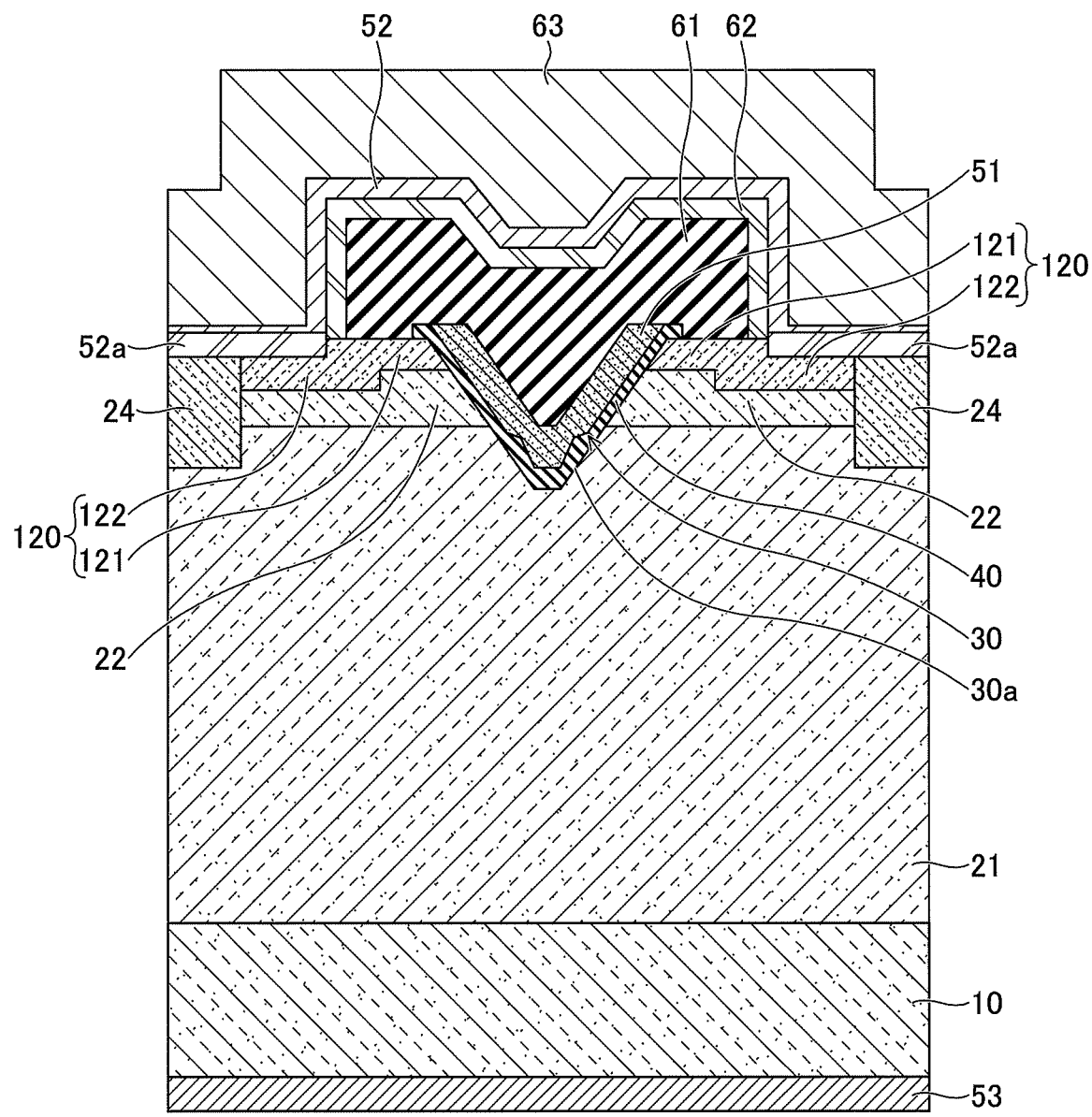
FIG. 13 is a structural diagram of a silicon carbide semiconductor device according to an embodiment of the present disclosure.

Next, a silicon carbide semiconductor device to be a vertical transistor according to the present embodiment will be described. In the silicon carbide semiconductor device according to the present embodiment, as illustrated in FIG. 13, on a first surface 10a of a silicon carbide single-crystal substrate 10, a first n-type layer 21, a p-type layer 22, and a second n-type layer 120 are formed in that order. The second n-type layer 120 is formed by a first area 121 in contact with a groove 30 and a second area 122 further away from the groove 30 than the first area 121, and as will be described later, the second area 122 is provided deeper than the first area 121 by 0.1 μm or more from the surface of the second n-type layer 120 toward the first n-type layer 21. Thereby, it is possible to prevent the concentration of the impurity element of the second n-type layer 120 in contact with a source electrode 52 from decreasing, to suppress the contact resistance with the source electrode 52 from increasing, and to cause a large current to flow.

The second n-type layer 120 is an n-type layer in which an impurity element for n-type is doped at a higher concentration than in the first n-type layer 21. In the silicon carbide semiconductor device according to the present embodiment, upon a predetermined voltage being applied to a gate electrode 51, a channel is formed in an area of the p-type layer 22 near a gate insulating film 40, and the first n-type layer 21 and the second n-type layer 120 are electrically conducted. This causes a current to flow between the source electrode 52 and a drain electrode 53, turning on the semiconductor device. It should be noted that when a predetermined voltage is not applied to the gate electrode 51, a channel is not formed in the p-type layer 22, and a current does not flow between the source electrode 52 and the drain electrode 53, and therefore, it is in the off state. It should be noted that in the present application, the first n-type layer 21 may be described as a first layer, the p-type layer 22 may be described as a second layer, and the second n-type layer 120 may be described as a third layer.

It should be noted that the silicon carbide single-crystal substrate 10 has a main surface inclined by an off angle θ from a predetermined crystal surface. It is preferable that the predetermined crystal plane is a (0001) plane or (000-1) plane. The polytype of silicon carbide in the silicon carbide single-crystal substrate 10 is 4H. This is because the 4H polytype silicon carbide is superior to other polytypes in electron mobility, dielectric breakdown electric field strength, and the like. The silicon carbide single-crystal substrate 10 has a diameter of 150 mm or more (e.g., 6 inches or more). This is because increasing the diameter is more advantageous in reducing the manufacturing cost of the semiconductor device. In the silicon carbide single-crystal substrate 10, the main surface is inclined with an off angle θ of 4° in the <11-20> direction with respect to the {0001} plane. In the present embodiment, the off angle θ may exceed 0° and be 6° or less. Also, in the silicon carbide semiconductor device according to the present embodiment, the source electrode 52 may be made of a TiAlSi film instead of a Ni film.

(Method of Manufacturing Silicon Carbide Semiconductor Device)

Next, steps of manufacturing a silicon carbide semiconductor device according to the present embodiment will be described with reference to FIG. 14 to FIG. 25. It should be noted that FIG. 14 to FIG. 25 partially differ from FIG. 13 in the shapes and the like for convenience.

Figure 14:
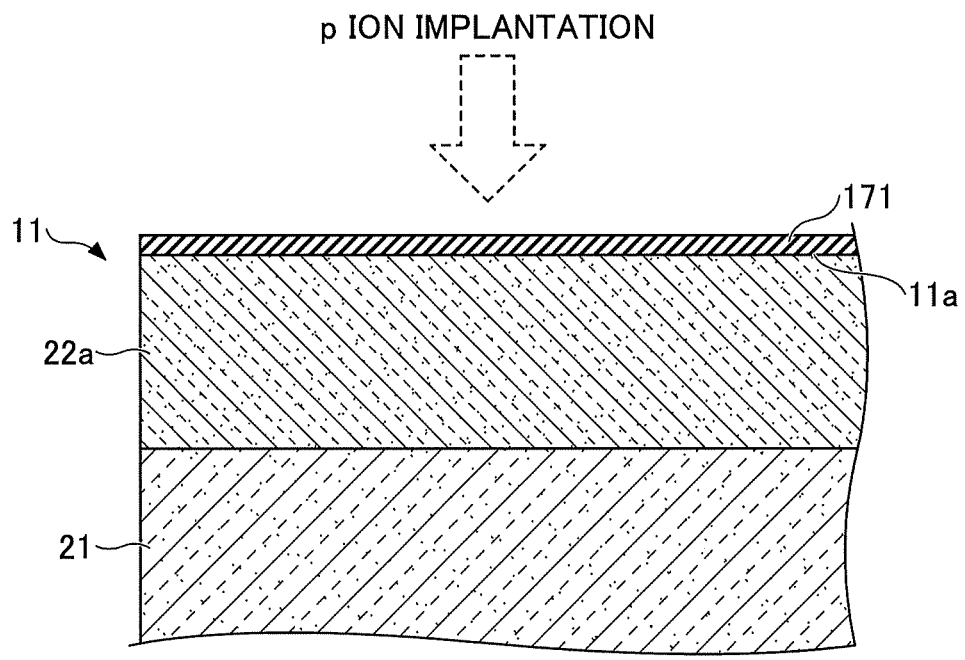
FIG. 14 is a diagram of a step (1) of a method of manufacturing a silicon carbide semiconductor device according to the embodiment of the present disclosure.

First, as illustrated in FIG. 14, an implant through film 171 is deposited on the surface 11*a* of the silicon carbide epitaxial layer 11 formed on the silicon carbide single-crystal substrate 10, and ions of Al as an impurity element for p-type are implanted via the implant through film 171. Thereby, a p-type area 22*a* for forming the p-type layer 22 is formed. The p-type area 22*a* is formed by ion implantation of Al to an area where the depth is 0.9 μm from the surface 11*a* of the silicon carbide epitaxial layer 11. In the p-type area 22*a* formed in this manner, the concentration of Al in the area having a depth of about 0.6 μm from the surface 11*a* of the silicon carbide epitaxial layer 11 is greater than or equal to $4 \times 10^{17}$ cm$^{-3}$. Thus, in the silicon carbide epitaxial layer 11, the area other than the p-type area 22*a* is the first n-type layer 21. The implant through film 171 is formed by CVD or a thermal oxide film, and for example, is formed by silicon oxide or polysilicon having a film thickness of 0.01 μm to 0.3 μm.

Figure 15:
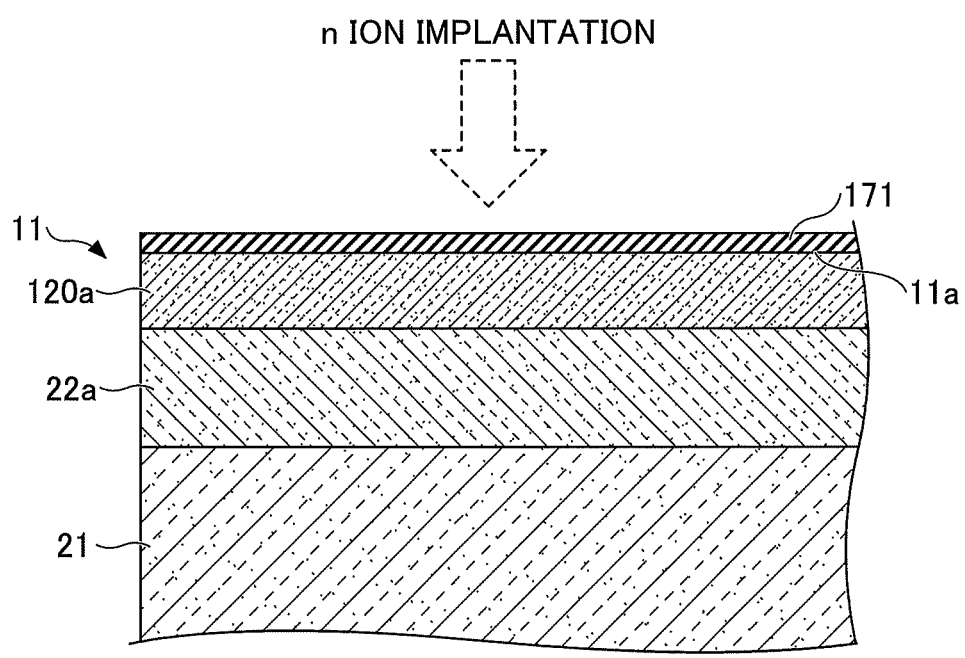
FIG. 15 is a diagram of a step (2) of the method of manufacturing the silicon carbide semiconductor device according to the embodiment of the present disclosure.

Next, as illustrated in FIG. 15, an upper portion 120*a* of the second n-type layer is formed by implanting ions of P as an impurity element for n-type via the implant through film 171. The upper portion 120*a* of the second n-type layer is formed by implanting ions of P to make n-type up to the depth of 0.42 μm from the surface 11*a* of the silicon carbide epitaxial layer 11. Thereby, the upper portion 120*a* of the second n-type layer is formed in which the concentration of the impurity element for n-type from the depth of 0.04 μm to 0.25 μm from the surface 11*a* of the silicon carbide epitaxial layer 11 is $1 \times 10^{19}$ cm$^{-3}$ or higher. It should be noted that in the area where the upper portion 120*a* of the second n-type layer is formed, although Al is ion-implanted as an impurity element for p-type, P, which is an impurity element for n-type, is ion-implanted at a higher concentration, and thus it is n-type. In the present application, the concentration of an impurity element for n-type is the concentration obtained by canceling out an impurity element for p-type from the impurity element for n-type, and the concentration of an impurity element for p-type is the concentration obtained by canceling out an impurity element for n-type from the impurity element for p-type.

Figure 16:
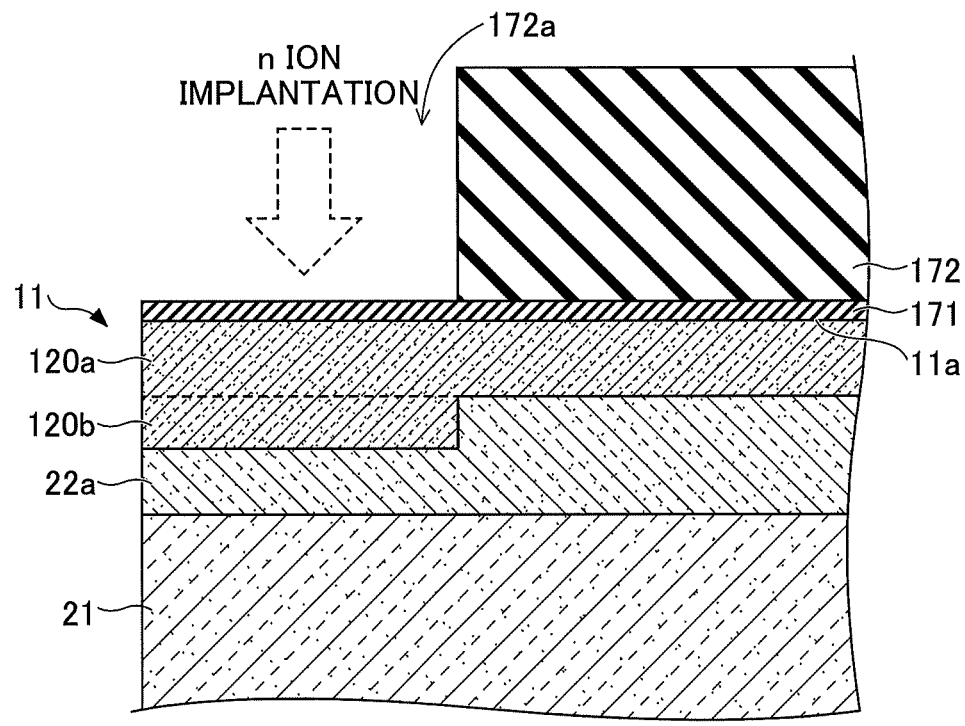
FIG. 16 is a diagram of a step (3) of the method of manufacturing the silicon carbide semiconductor device according to the embodiment of the present disclosure.

Next, as illustrated in FIG. 16, an implant mask 172 having an opening portion 172*a* is to be formed at the area where the second area 122 of the second n-type layer 120 is formed, and the lower portion 120*b* of the second re-type layer is formed by implanting ions of P via the implant through film 171. The implant mask 172 is formed of silicon oxide having a film thickness of, for example, 1 μm to 3 μm by CVD. The silicon oxide film is deposited on the implant through film 171, a photoresist is applied on the deposited silicon oxide film, and exposure and development are performed by an exposure apparatus. Thereby, an unillustrated resist pattern is formed having an opening portion at the area where the second area 122 of the second n-type layer 120, which will be described later, is to be formed. Then, by removing the silicon oxide film at the opening portion of the resist pattern by RIE or the like, the implant mask 172 having the opening portion 172*a* is formed, and the unillustrated resist pattern is removed by an organic solvent or the like. Then, the lower portion 120*b* of the second n-type layer is formed by implanting ions of P as an impurity element for n-type via the implant through film 171. The lower portion 120*b* of the second n-type layer is formed by implanting ions of P to make n-type up to the depth of 0.54 μm from the surface 11*a* of the silicon carbide epitaxial layer 11. It should be noted that in the area where the lower portion 120*b* of the second n-type layer is formed, although Al is ion-implanted as an impurity element for p-type, P, which is an impurity element for n-type, is ion-implanted at a higher concentration, and thus it is n-type. Thereby, the lower portion 120*b* of the second n-type layer is formed in which the concentration of P is $1 \times 10^{19}$ cm$^{-3}$ or higher from the depth of 0.04 μm to 0.34 μm from the surface 11*a* of the silicon carbide epitaxial layer 11.

Figure 17:
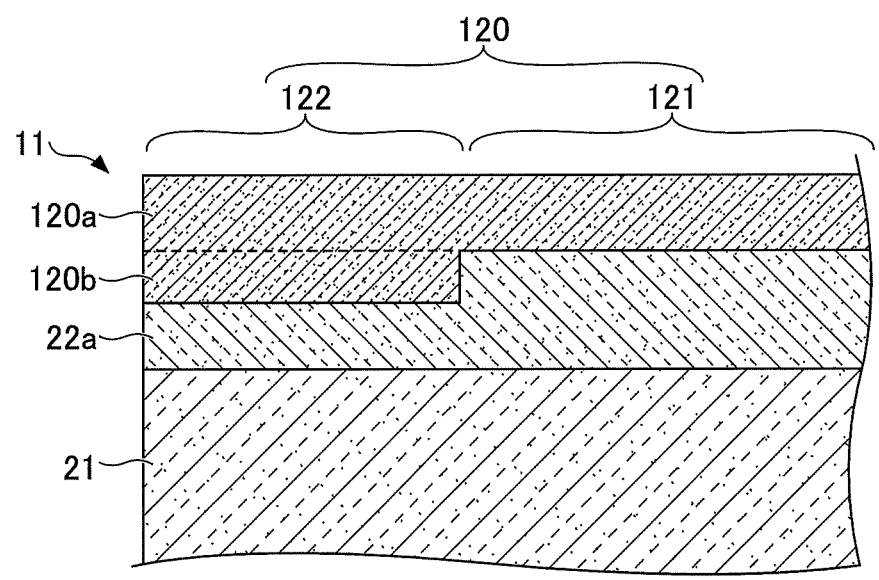
FIG. 17 is a diagram of a step (4) of the method of manufacturing the silicon carbide semiconductor device according to the embodiment of the present disclosure.

The implant mask 172 and the implant through film 171 are then removed by dry etching or wet etching as illustrated in FIG. 17. As a result of the above steps, the second n-type layer 120 is formed having the first area 121 in which only the upper portion 120*a* of the second n-type layer is formed and the second area 122 in which the upper portion 120*a* of the second n-type layer and the lower portion 120*b* of the second n-type layer are formed. It should be noted that within the p-type area 22*a*, the area of maintaining p-type becomes the p-type layer 22, and in the silicon carbide epitaxial layer 11, the area excluding the second n-type layer 120 and the p-type layer 22 become the first n-type layer 21.

Figure 26:
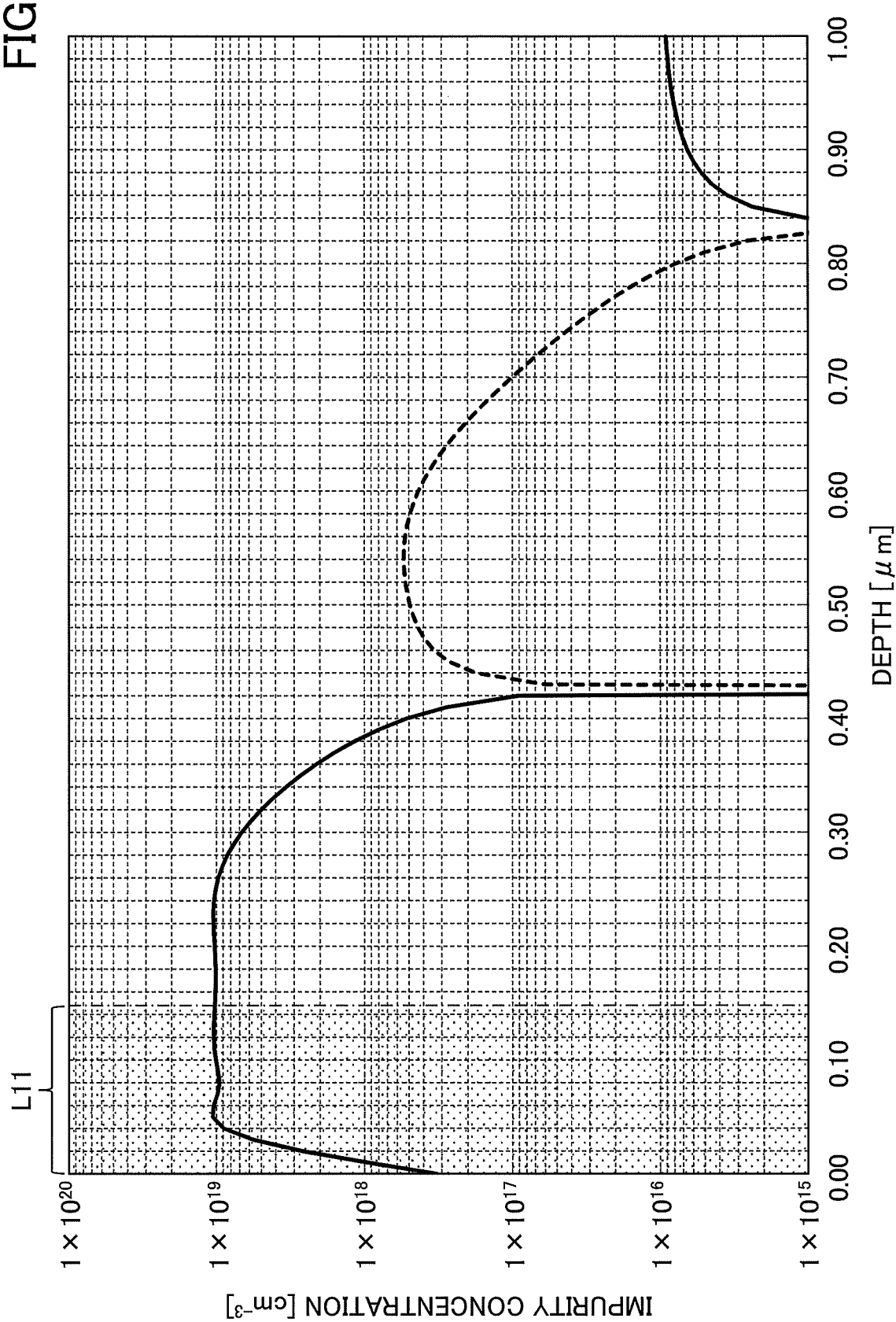
FIG. 26 is a diagram (1) describing the impurity concentration in the silicon carbide semiconductor device according to the embodiment of the present disclosure.
Figure 27:
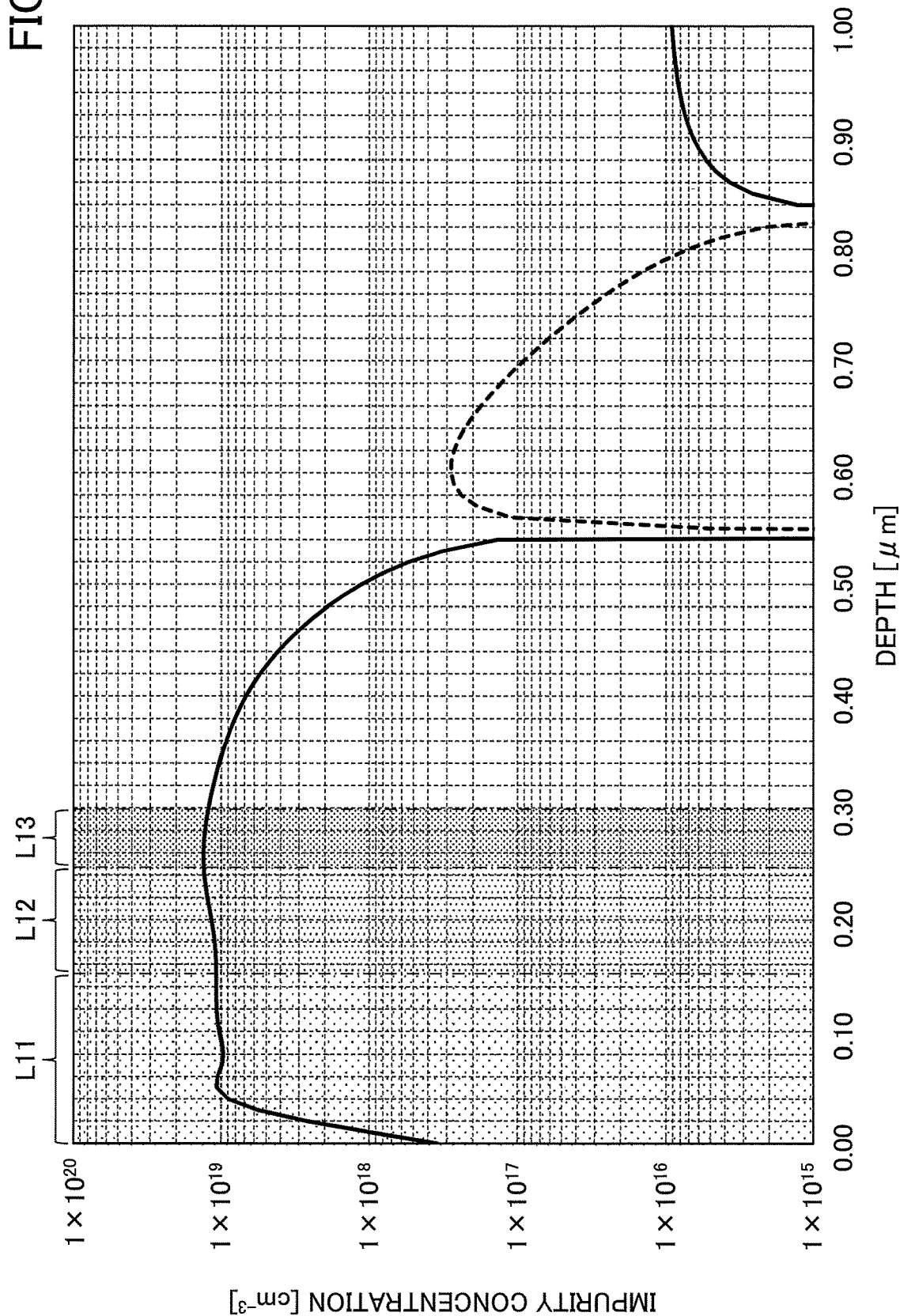
FIG. 27 is a diagram (2) describing the impurity concentration in the silicon carbide semiconductor device according to the embodiment of the present disclosure.

FIG. 26 illustrates the relationship between the depth from the surface in the first area 121 of the second n-type layer 120 and the impurity concentration, and FIG. 27 illustrates the relationship between the depth from the surface in the second area 122 of the second n-type layer 120 and the impurity concentration. As illustrated in FIG. 26 and FIG. 27, the second n-type layer 120 is formed to a depth of 0.42 μm in the first area 121 and is formed to a depth of 0.54 μm in the second area 122, from the surface 11*a* of the silicon carbide epitaxial layer 11. Accordingly, the second area 122 is formed deeper than the first area 121 by 0.1 μm or more from the surface of the second n-type layer 120 toward the first n-type layer 21.

Figure 18:
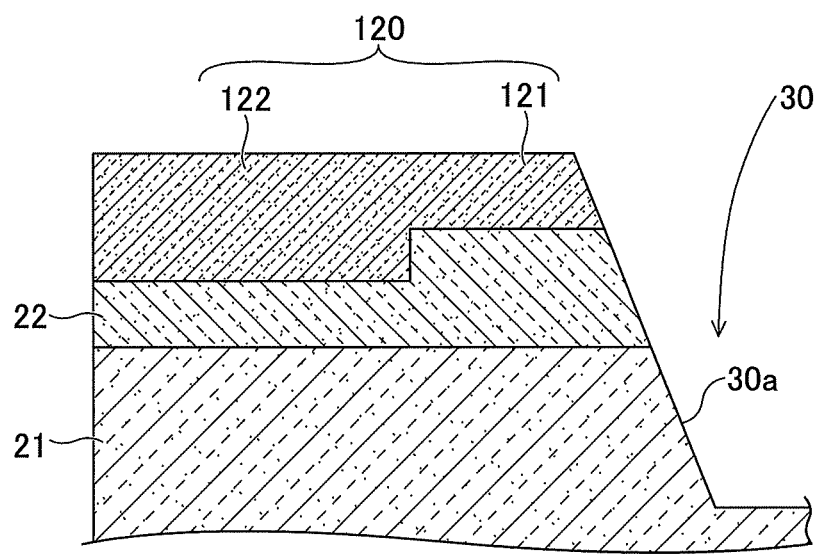
FIG. 18 is a diagram of a step (5) of the method of manufacturing the silicon carbide semiconductor device according to the embodiment of the present disclosure.
Figure 19:
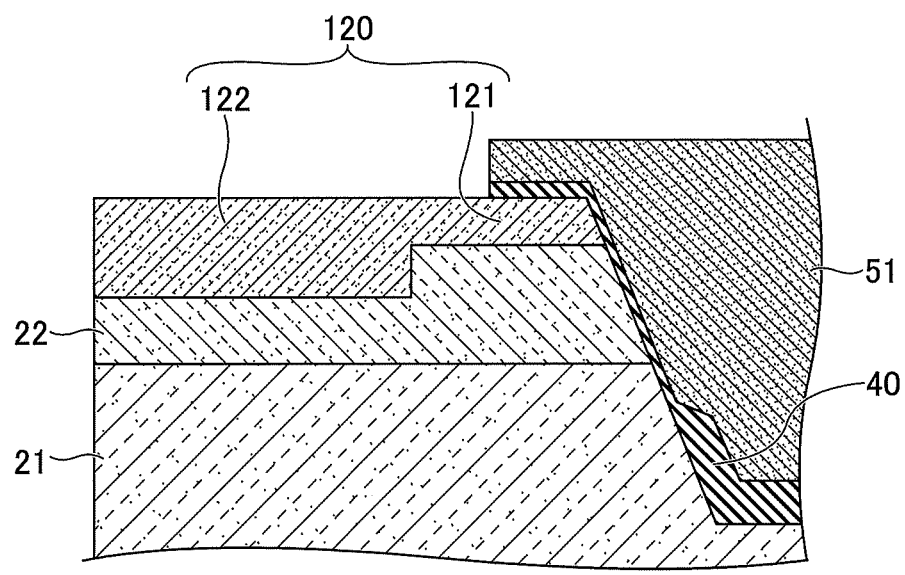
FIG. 19 is a diagram of a step (6) of the method of manufacturing the silicon carbide semiconductor device according to the embodiment of the present disclosure.

Then, as illustrated in FIG. 18, the groove 30 is formed by partially removing the silicon carbide epitaxial layer from the surface on which the second n-type layer 120 is formed. Thereby, at the side wall 30a of the groove 30, portions of the first area 121 of the second n-type layer 120, the p-type layer 22, and the first n-type layer 21 are exposed. Specifically, a silicon oxide film is deposited on the second n-type layer 120 by CVD, a photoresist is applied on the deposited silicon oxide film, and exposure and development by an exposure apparatus is performed to form a resist pattern having an opening portion at an area corresponding to the groove 30. Then, the silicon oxide film exposed at the opening portion of the resist pattern is removed by RIE or the like to form an unillustrated silicon oxide mask for forming the groove 30 with silicon oxide. Thereafter, the silicon carbide semiconductor layer exposed at the silicon oxide mask is removed by RIE or the like, and the groove 30 is formed by thermal etching. The silicon oxide mask is then removed by wet etching. Thereafter, as illustrated in FIG. 19, the gate insulating film 40 is formed by thermal oxidation within the groove 30, and the gate electrode 51 is formed by CVD on the gate insulating film 40.

In the steps described above, due to the steps of forming the implant through film 171, removing the implant through film 171, and forming the gate insulating film 40, the second n-type layer 120 is lost about by 0.15 μm in thickness, as illustrated by L11 in FIG. 26 and FIG. 27.

Figure 20:
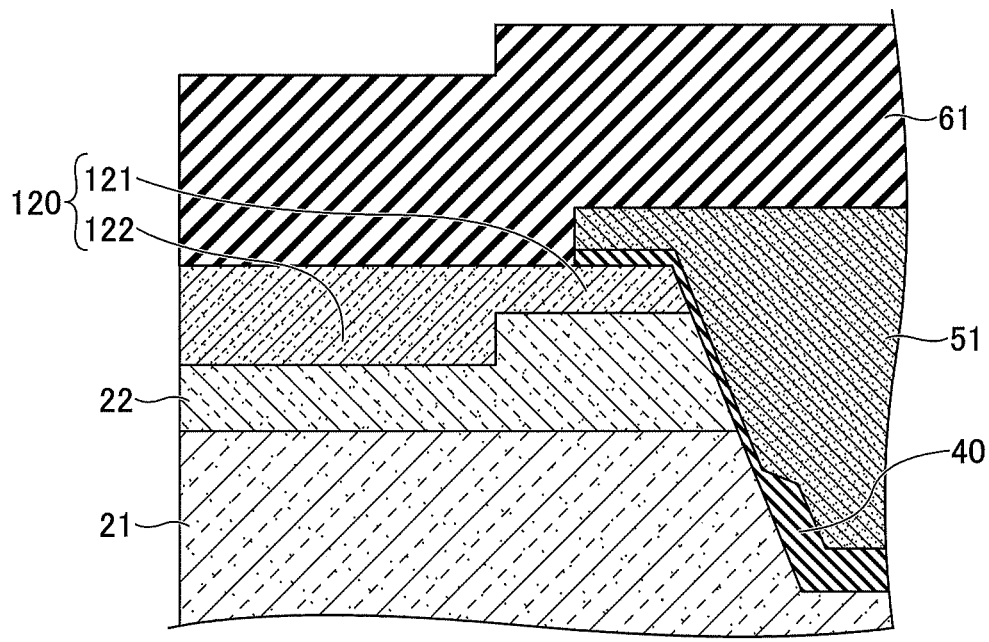
FIG. 20 is a diagram of a step (7) of the method of manufacturing the silicon carbide semiconductor device according to the embodiment of the present disclosure.

Next, as illustrated in FIG. 20, the interlayer insulating film 61 is formed by depositing a silicon oxide film by CVD on the entire surfaces of the gate electrode 51 and the second n-type layer 120.

Figure 21:
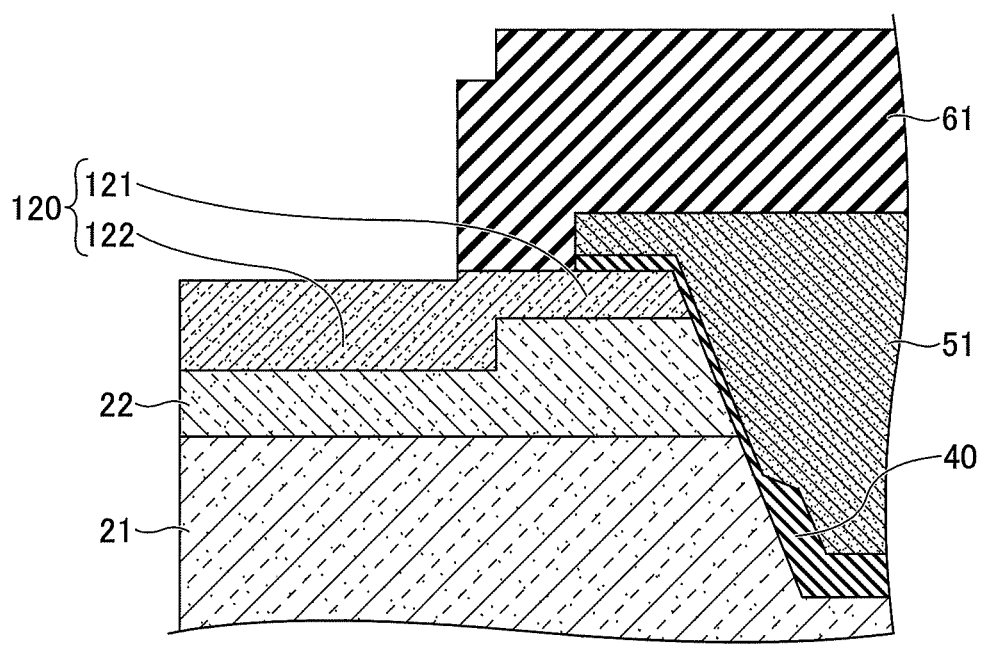
FIG. 21 is a diagram of a step (8) of the method of manufacturing the silicon carbide semiconductor device according to the embodiment of the present disclosure.

Next, as illustrated in FIG. 21, the interlayer insulating film 61 at the area where the source electrode 52 is to be formed on the second area 122 of the second n-type layer 120 is removed. Specifically, a photoresist is applied on the interlayer insulating film 61, and then it is exposed and developed by an exposure apparatus to form an unillustrated resist pattern having an opening in the area where the source electrode 52 is to be famed on the second n-type layer 120. Thereafter, the interlayer insulating film 61 in the area where the resist pattern is not formed is removed by dry etching, such as RIE, to expose the second n-type layer 120. At this time, it is extremely difficult to stop the etching immediately after the interlayer insulating film 61 is removed and the second n-type layer 120 is exposed, and there is a variation in the etching and the like. Therefore, a part of the second n-type layer 120 is removed by over-etching.

Figure 22:
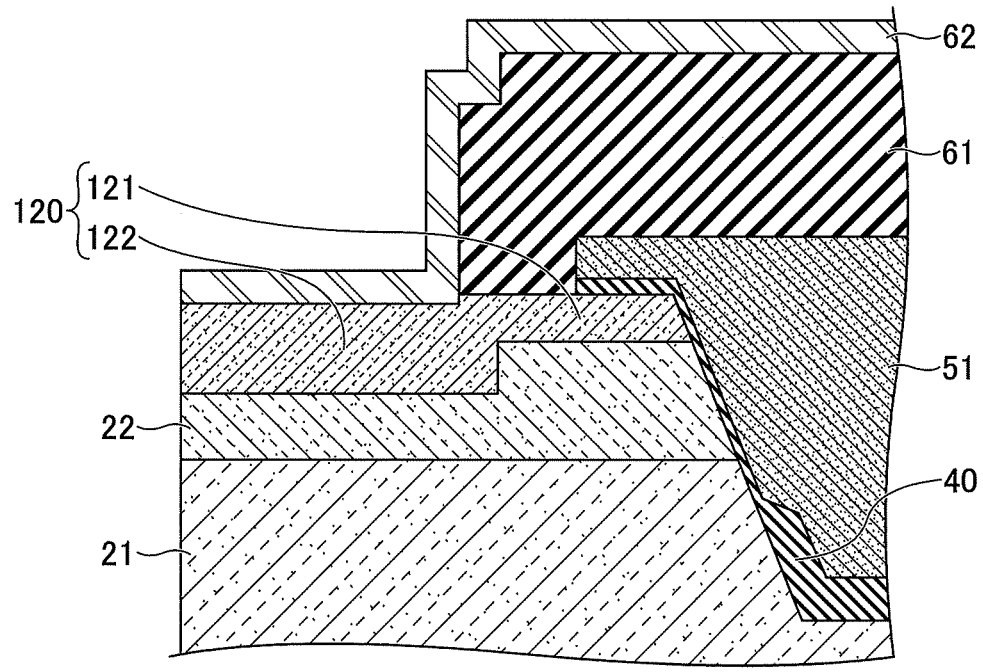
FIG. 22 is a diagram of a step (9) of the method of manufacturing the silicon carbide semiconductor device according to the embodiment of the present disclosure.

Next, as illustrated in FIG. 22, the barrier metal layer 62 is formed by depositing a titanium nitride film through sputtering on the entire surfaces of the interlayer insulating film 61 and the second n-type layer 120.

Figure 23:
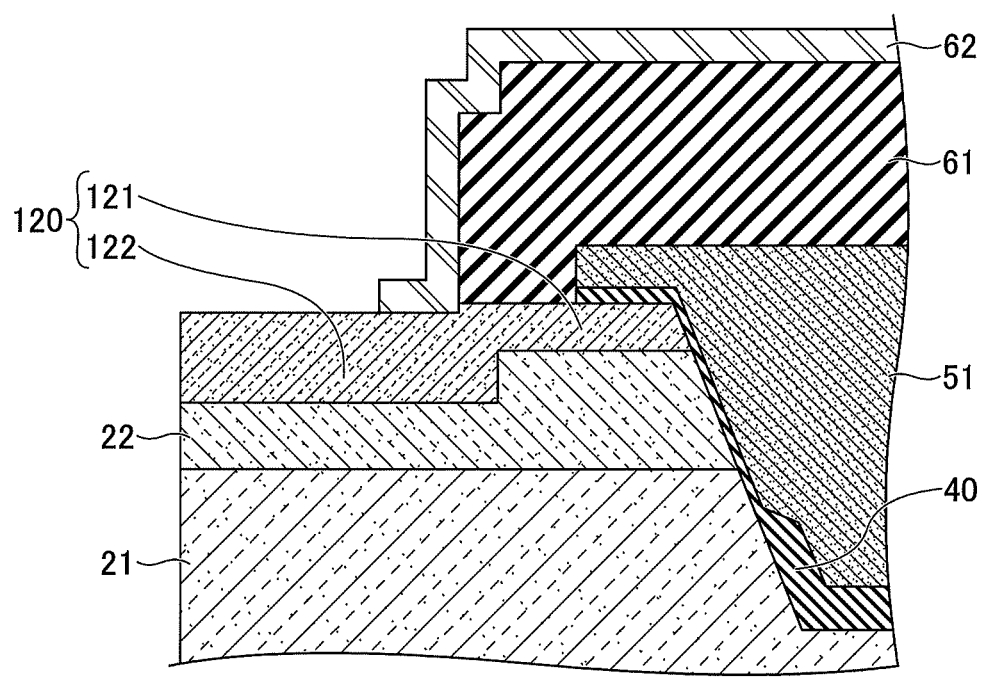
FIG. 23 is a diagram of a step (10) of the method of manufacturing the silicon carbide semiconductor device according to the embodiment of the present disclosure.

Next, as illustrated in FIG. 23, the barrier metal layer 62 at the area where the source electrode 52 is to be formed on the second area 122 of the second n-type layer 120 is removed. Specifically, a photoresist is applied on the barrier metal layer 62, and then it is exposed and developed by an exposure apparatus to form an unillustrated resist pattern having an opening in the area where the source electrode 52 is to be formed on the second n-type layer 120. The barrier metal layer 62 at the area where the resist pattern is not formed is then removed by dry etching, such as RIE, to expose the second n-type layer 120. At this time, it is extremely difficult to stop the etching immediately after removing the barrier metal layer 62 and exposing the second n-type layer 120, and there is a variation in the etching and the like. Therefore, a part of the second n-type layer 120 is removed by over-etching.

Accordingly, due to the overetching of the second n-type layer 120 in the step of forming the barrier metal layer 62 and the step of forming the interlayer insulating film 61, the second n-type layer 120 at the second area 122 is lost by about 0.1 μm in thickness as illustrated by L12 in FIG. 27. It should be noted that at this time, the second n-type layer 120 at the first area 121 is not lost.

Figure 24:
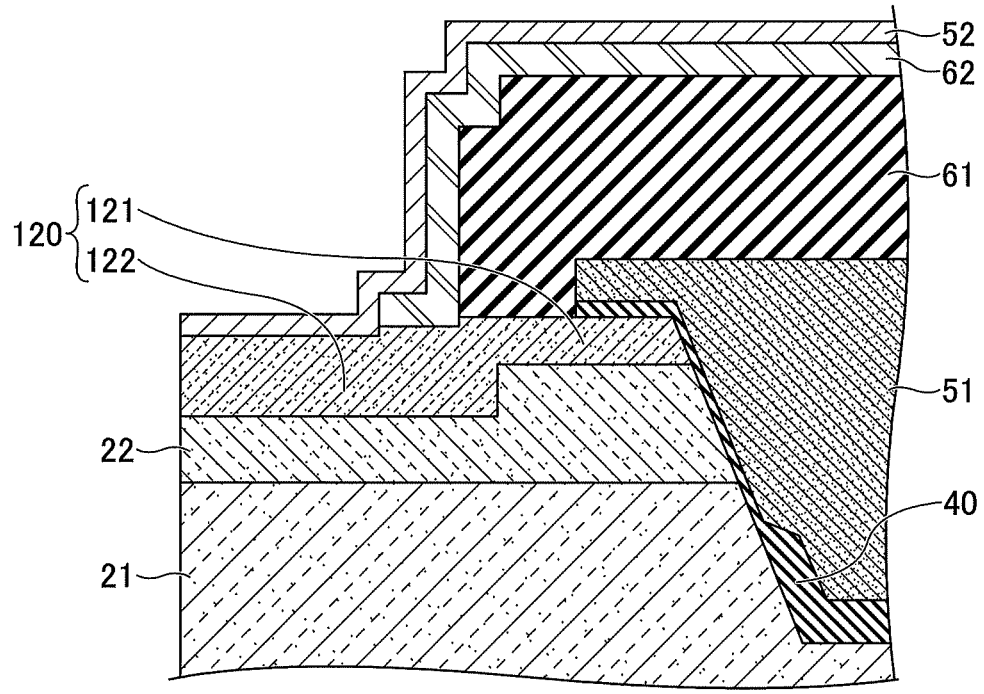
FIG. 24 is a diagram of a step (11) of the method of manufacturing the silicon carbide semiconductor device according to the embodiment of the present disclosure.

Next, as illustrated in FIG. 24, a nickel (Ni) film is formed on the barrier metal layer 62 and the second n-type layer 120 to form the source electrode 52.

Figure 25:
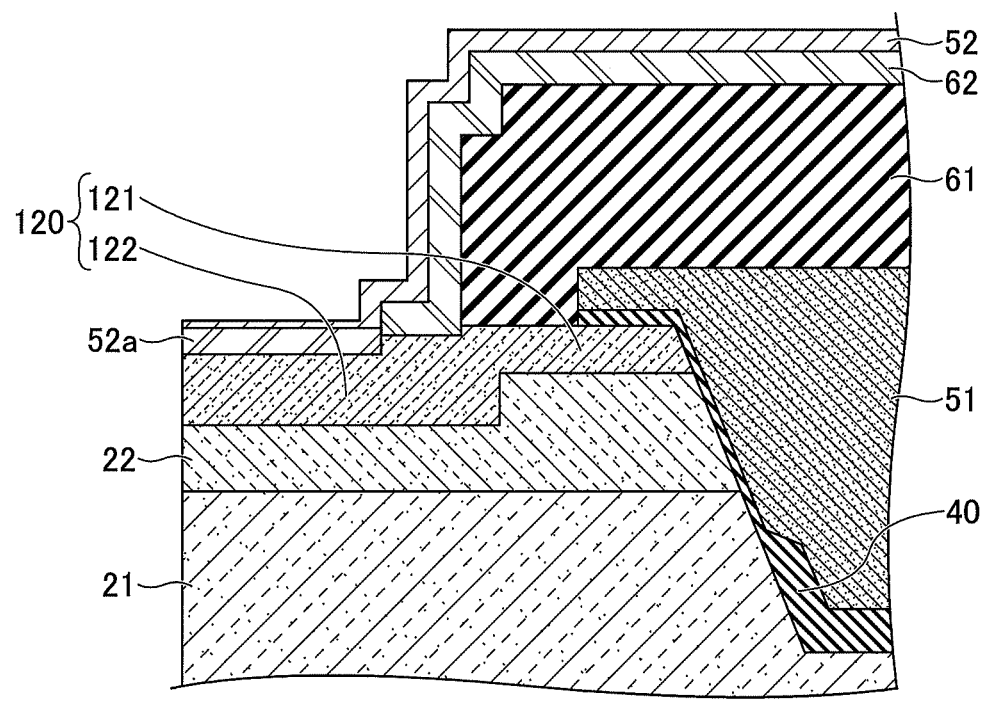
FIG. 25 is a diagram of a step (12) of the method of manufacturing the silicon carbide semiconductor device according to the embodiment of the present disclosure.

Next, as illustrated in FIG. 25, by performing a heat treatment at a temperature of about 1000° C., Si of the second n-type layer 120 and the Ni film forming the source electrode 52 on the second n-type layer 120 are alloyed, and the NiSi alloy layer 52a is formed.

In the step of forming the NiSi alloy layer 52a, in order to form the NiSi alloy layer 52a, the second n-type layer 120 at the second area 122 is lost by about 0.1 μm in thickness, as illustrated by L13 of FIG. 27. It should be noted that at this time, the second n-type layer 120 at the first area 121 is not lost.

As described above, when manufacturing the silicon carbide semiconductor device according to the present embodiment, in the second area 122, the second n-type layer 120 is lost from the surface by about 0.3 μm, which is the sum of L11, L12, and L13. However, as illustrated in FIG. 27, the concentration of the impurity element of the second n-type layer 120 in the second area. 122 in contact with the source electrode 52 is greater than or equal to $1 \times 10^{19}$ cm$^{-3}$. Accordingly, in the present embodiment, because the concentration of the impurity element of the second n-type layer 120 in contact with the source electrode 52 is high, the contact resistance with the source electrode 52 is reduced, and it is possible to cause a large current to flow.

A source wiring layer 63 is then formed on the source electrode 52 by Al. Thereby, it is possible to manufacture the silicon carbide semiconductor device according to the present embodiment, as illustrated in FIG. 13.

Although the embodiment has been described above in detail, it is not limited to a specific embodiment, and various modifications and changes can be made within the scope described in claims.

DESCRIPTION OF THE REFERENCE NUMERALS 10 silicon carbide single-crystal substrate
10a first surface
10b second surface
11 silicon carbide epitaxial layer
11a surface
21 first n-type layer
22 p-type layer
23 second n-type layer
24 high concentration p-type area
30 groove
30a sidewall
40 gate insulating film
51 gate electrode
52 source electrode
52a NiSi alloy layer
53 drain electrode
61 interlayer insulating film
62 barrier metal layer
120 second n-type layer
120a upper portion of second n-type layer
120b lower portion of second n-type layer 121 first area
122 second area

The invention claimed is:

1. A silicon carbide semiconductor device that is a vertical transistor, the silicon carbide semiconductor device comprising:
   a silicon carbide semiconductor first layer of a first conductivity type;
   a silicon carbide semiconductor second layer of a second conductivity type that is different from the first conductivity type on the first layer;
   a silicon carbide semiconductor third layer of the first conductivity type on the second layer; and
   a groove having a sidewall at portions of the third layer, the second layer, and the first layer,
   wherein the third layer has a first area facing the sidewall of the groove and a second area further away from the sidewall of the groove than the first area,
   wherein the second area and the first area are continuous, and
   wherein the second layer has a surface in direct contact with the third layer, and the surface of the second layer under the second area is provided deeper than the surface of the second layer under the first area by 0.1 µm or more from a surface side of the third layer toward the first layer.

2. The silicon carbide semiconductor device according to claim 1, further comprising a source electrode in contact with the second area of the third layer.

3. The silicon carbide semiconductor device according to claim 2,
   wherein the first layer is formed on a first surface of a silicon carbide substrate,
   wherein an insulating film is provided within the groove,
   wherein a gate electrode is provided on the insulating film, and
   wherein a drain electrode is provided on a second surface, which is opposite to the first surface, of the silicon carbide substrate.

4. The silicon carbide semiconductor device according to claim 2, wherein the source electrode includes Ni.

5. The silicon carbide semiconductor device according to claim 2 wherein the source electrode includes Al, Ti and Si.

6. A silicon carbide semiconductor device that is a vertical transistor, the silicon carbide semiconductor device comprising:
   a silicon carbide semiconductor first layer of a first conductivity type;
   a silicon carbide semiconductor second layer of a second conductivity type that is different from the first conductivity type on the first layer;
   a silicon carbide semiconductor third layer of the first conductivity type on the second layer; and
   a groove having a sidewall at portions of the third layer, the second layer, and the first layer,
   wherein the third layer has a first area facing the sidewall of the groove and a second area further away from the sidewall of the groove than the first area,
   wherein the second area and the first area are continuous,
   wherein the second area is provided deeper than the first area from a surface side of the third layer toward the first layer,
   wherein the silicon carbide semiconductor device includes a source electrode in contact with the second area of the third layer,
   wherein the first layer is formed on a first surface of a silicon carbide substrate,
   wherein an insulating film is provided within the groove,
   wherein a gate electrode is provided on the insulating film,
   wherein a drain electrode is provided on a second surface, which is opposite to the first surface, of the silicon carbide substrate,
   wherein the source electrode includes Ni, and
   wherein the second layer has a surface in direct contact with the third layer, and the surface of the second layer under the second area is provided deeper than the surface of the second layer under the first area by 0.1 µm or more from the surface of the third layer toward the first layer.

* * * * *